(12) United States Patent
Fang

(10) Patent No.: US 6,805,812 B2
(45) Date of Patent: Oct. 19, 2004

(54) PHOSPHONO COMPOUND-CONTAINING POLISHING COMPOSITION AND METHOD OF USING SAME

(75) Inventor: Mingming Fang, Naperville, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 224 days.

(21) Appl. No.: 09/975,335

(22) Filed: Oct. 11, 2001

(65) Prior Publication Data

US 2003/0134575 A1 Jul. 17, 2003

(51) Int. Cl.$^7$ .................. C09K 13/00; C09K 13/06; H01I 21/302
(52) U.S. Cl. ................ 252/79.1; 252/79.4; 438/692
(58) Field of Search ............ 252/79.1, 79.4; 438/692

(56) References Cited

U.S. PATENT DOCUMENTS

| | | | |
|---|---|---|---|
| 5,709,588 A | 1/1998 | Muroyama | 451/41 |
| 5,783,489 A * | 7/1998 | Kaufman et al. | 438/692 |
| 5,897,375 A | 4/1999 | Watts et al. | 438/693 |
| 5,904,159 A | 5/1999 | Kato et al. | 134/7 |
| 5,980,775 A * | 11/1999 | Grumbine et al. | 252/79.1 |
| 6,001,730 A | 12/1999 | Farkas et al. | 438/627 |
| 6,027,669 A | 2/2000 | Miura et al. | 252/518.1 |
| 6,068,879 A * | 5/2000 | Pasch | 427/97 |
| 6,136,714 A | 10/2000 | Schutz | 438/692 |
| 6,139,763 A | 10/2000 | Ina et al. | 216/89 |

FOREIGN PATENT DOCUMENTS

| | | |
|---|---|---|
| EP | 0 984 049 A1 | 3/2000 |
| EP | 1 006 166 A1 | 6/2000 |
| WO | WO 00/24842 A1 | 5/2000 |
| WO | WO 01/12740 | 2/2001 |

* cited by examiner

*Primary Examiner*—Nadine G. Norton
*Assistant Examiner*—Lynette T. Umez-Eronini

(57) ABSTRACT

The invention provides a chemical-mechanical polishing system for a substrate comprising a liquid carrier, a polishing pad and/or an abrasive, a per-type oxidizer, and a phosphono group-containing additive, as well as a method of using the same to polish substrates, particularly nickel-containing substrates.

19 Claims, No Drawings

PHOSPHONO COMPOUND-CONTAINING POLISHING COMPOSITION AND METHOD OF USING SAME

FIELD OF THE INVENTION

This invention pertains to a chemical-mechanical polishing system that can be used for the polishing of substrates such as semiconductor substrates, metallurgical samples, memory disk surfaces, magnetic heads, optical components, lenses, wafer masks, and the like.

BACKGROUND OF THE INVENTION

In a typical chemical-mechanical polishing (CMP) system, a silicon wafer, semiconductor, or other such substrate to be polished is placed in direct contact with a rotating polishing pad. During the polishing process, the polishing pad is rotated while a downward force is maintained against the back of the substrate to cause the front of the substrate to contact the polishing pad. An abrasive and chemically reactive solution, referred to as a chemical-mechanical polishing composition or slurry, is applied to the polishing pad during the polishing (also referred to as planarization) of the substrate. The polishing composition often is comprised of an abrasive, an oxidizing agent, a liquid carrier, and other useful additives. The polishing composition assists the polishing process by both mechanically abrading and chemically reacting with the surface of the substrate. The polishing process is facilitated by the rotational movement of the polishing pad relative to the substrate while the polishing composition is provided to the substrate/polishing pad interface.

Polishing is continued in this manner until the desired material on the substrate is removed and the substrate surface is planar. Tailoring the polishing composition to meet the polishing requirements of a particular substrate (e.g., removing the desired material on the substrate as quickly as possible while minimizing surface imperfections, defects, corrosion, and erosion) is crucial to the success of a CMP process.

Many polishing compositions have been designed and disclosed as especially useful for particular CMP processes. For example, U.S. Pat. No. 5,244,534 discloses a polishing composition, containing alumina, hydrogen peroxide, water, and either potassium or ammonium hydroxide, which is useful to remove tungsten from a substrate at predictable rates with little removal of the underlying insulating layer. U.S. Pat. No. 5,209,816 discloses a polishing composition, comprising a solid abrasive material, hydrogen peroxide, perchloric acid and water, which is useful for polishing aluminum. U.S. Pat. No. 5,340,370 discloses a polishing composition, for polishing tungsten or titanium nitride, comprising silica, potassium ferricyanide, water, and optionally potassium acetate. U.S. Pat. No. 5,769,689 discloses the synergistic combination of amines and water-soluble salts in low concentrations in polishing compositions for polishing certain substrates. U.S. Pat. No. 4,789,648 discloses a polishing composition comprising alumina abrasives in conjunction with sulfuric, nitric, and acetic acids and deionized water. Other polishing compositions for use in CMP processes are described in U.S. Pat. Nos. 4,956,313, 5,137,544, 5,157,876, 5,354,490, and 5,527,423.

Although many polishing compositions for CMP processes have been developed and disclosed in the literature, there remains a need for further polishing compositions, particularly a chemical-mechanical polishing system suitable for effectively polishing a metal substrate. The invention provides such a polishing system and a method of using the polishing system to polish a substrate. These and other advantages of the invention, as well as additional inventive features, will be apparent from the description of the invention provided herein.

BRIEF SUMMARY OF THE INVENTION

The invention provides a chemical-mechanical polishing system for a substrate comprising (a) a liquid carrier, (b) a polishing pad and/or an abrasive, (c) a per-type oxidizer, and (d) an additive. The additive is of the formula

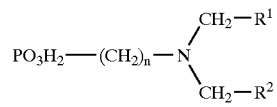

wherein $R^1$ is a phosphono group, a carboxyl group or a salt thereof, $R^2$ is a phosphono group, a carboxyl group or a salt thereof, and n is an integer from 1 to 50. The invention also provides a method of polishing a substrate comprising (a) contacting a substrate with the aforementioned polishing composition and (b) abrading at least a portion of the substrate to polish the substrate. When the substrate is a nickel-containing substrate, the additive additionally can be either 1,2,4-triazole or piperazine.

DETAILED DESCRIPTION OF THE INVENTION

The invention provides a chemical-mechanical polishing system for a substrate. The chemical-mechanical polishing system comprises (a) a liquid carrier, (b) a polishing pad and/or an abrasive, (c) a per-type oxidizer, and (d) an additive. The additive is of the formula

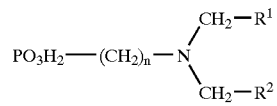

wherein $R^1$ is a phosphono group or a carboxyl group, $R^2$ is a phosphono group or a carboxyl group, and n is an integer from 1 to 50. The liquid carrier, the abrasive (when present and suspended in the liquid carrier), the per-type oxidizer, and the additive, as well as any other components suspended in the liquid carrier, form the polishing composition of the CMP system.

The chemical-mechanical polishing system comprises an abrasive, a polishing pad, or both. Preferably, the CMP system comprises both an abrasive and a polishing pad. The abrasive can be fixed on the polishing pad and/or can be in particulate form and suspended in the liquid carrier. The polishing pad can be any suitable polishing pad.

The abrasive can be any suitable abrasive. For example, the abrasive particles can be natural or synthetic and can include diamond (e.g., polycrystalline diamond), garnet, glass, carborundum, and metal oxide (e.g., silica, fused alumina, ceramic alumina, chromia, and iron oxide) particles. The abrasive particles can be coated particle abrasives. The abrasive desirably is a metal oxide abrasive and more preferably is selected from the group consisting of alumina, silica, titania, ceria, zirconia, germania, magnesia, co-formed products thereof, and combinations thereof. Most preferably, the abrasive is silica. The metal oxide abrasive generally will comprise fumed, precipitated, and/or condensation-polymerized metal oxide particles.

The abrasive can have any suitable characteristics. The abrasive preferably is in particulate form, with the abrasive particles desirably having an average particle diameter of about 1 μm or less (preferably, about 0.01 μm to about 0.5 μm) and desirably having a surface area (as measured by the BET method described in S. Brunauer, P. H. Emmet, and I. Teller, *J. Am. Chemical Society*, 60, 309 (1938)) of about 5 m²/g to about 400 m²/g (preferably, about 20 m²/g to about 200 m²/g).

Due to stringent purity requirements in the electronics industry, the abrasive, particularly a metal oxide abrasive, should be of a high purity. High purity means that the total impurity content, from sources such as raw material impurities and trace processing contaminants, typically is less than 1 wt. % and preferably less than 0.01 wt. % (i.e., less than 100 ppm).

When the abrasive is present in the CMP system and is suspended in the liquid carrier (i.e., when the abrasive is a component of the polishing composition), any suitable amount of abrasive can be present in the polishing composition. Typically, about 1 wt. % or more (e.g., about 4 wt. % or more) abrasive will be present in the polishing composition. The amount of abrasive in the polishing composition typically will not exceed about 30 wt. %, more typically will not exceed about 20 wt. % (e.g., will not exceed about 10 wt. %). Preferably, the amount of abrasive in the polishing composition will be about 1 wt. % to about 6 wt. %.

The CMP system further comprises an additive. The additive is of the formula

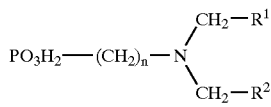

wherein $R^1$ is a phosphono group or a carboxyl group, $R^2$ is a phosphono group or a carboxyl group, and n is a positive integer from 1 to 50.

The chemical-mechanical polishing system of the invention comprises several preferred additives. Preferred additives include (a) the aforementioned additive wherein $R^1$ and $R^2$ are carboxyl groups, and n is a positive integer from 1 to 10, particularly 1 to 5, and especially 1, and (b) the aforementioned additive wherein $R^1$ and $R^2$ are phosphono groups, and n is a positive integer from 1 to 10, particularly 1 to 5, and especially 1. An alternative additive is the aforementioned additive wherein $R^1$ is a carboxyl group, $R^2$ is a phosphono group, and n is a positive integer from 1 to 10, particularly 1 to 5, and especially 1.

The CMP system further comprises a per-type oxidizer. An oxidizing agent is particularly useful when polishing metals and metal-based components such as substrates containing titanium, titanium nitride, tantalum, tantalum nitride, copper, tungsten, aluminum, and mixtures, combinations, and alloys thereof (e.g., aluminum/copper alloys).

The oxidizing agent desirably activates the otherwise unreactive metal on the substrate to be polished by converting the atoms of the metal into a higher oxidation state. In this higher oxidation state, these atoms are more reactive toward their environment. In an aqueous medium, these activated atoms react with water to form their corresponding oxide, hydroxide, or aqua species. The oxidizing agent desirably is present in the polishing composition in an amount sufficient to convert the underlying unoxidized metal to a higher valent state (e.g., copper (0) to copper (II)).

The per-type oxidizer is an inorganic or organic per-compound. A per-compound (as defined by Hawley's Condensed Chemical Dictionary) is a compound containing at least one peroxy group (—O—O—) or a compound containing an element in its highest oxidation state. Examples of compounds containing at least one peroxy group include but are not limited to hydrogen peroxide and its adducts such as urea hydrogen peroxide and percarbonates, organic peroxides such as benzoyl peroxide, peracetic acid, and di-tert-butyl peroxide, monopersulfates ($SO_5^{2-}$), dipersulfates ($S_2O_8^{2-}$), and sodium peroxide. Examples of compounds containing an element in its highest oxidation state include but are not limited to periodic acid, periodate salts, perbromic acid, perbromate salts, perchloric acid, perchloric salts, perboric acid, perborate salts, and permanganates. The per-type oxidizer preferably is hydrogen peroxide.

Any suitable amount of the oxidizer can be present in the polishing composition. Typically, about 0.01 wt. % or more (e.g., about 0.1 wt. % or more) oxidizer will be present in the polishing composition. More typically, about 0.2 wt. % or more (e.g., about 0.5 wt. % or more) oxidizer will be present in the polishing composition. The amount of oxidizer in the polishing composition typically will not exceed about 10 wt. %, and more typically will not exceed about 5 wt. % (e.g., will not exceed about 2 wt. %).

A liquid carrier is used to facilitate the application of the abrasive (when present), per-type oxidizer, and additive, as well as any other dissolved or suspended components of the polishing composition, to the surface of a suitable substrate to be polished. The liquid carrier can be any suitable liquid carrier or emulsion. Preferably, the liquid carrier comprises, consists essentially of, or consists of water, more preferably deionized water.

The CMP system further can include a film-forming agent. The film-forming agent can be any compound or mixture of compounds that facilitates the formation of a passivation layer of metal oxide and/or dissolution-inhibiting layer on the surface of a metal to minimize the chemical removal of the metal from the substrate. Suitable film forming agents comprise at least one organic heterocycle ring formed from 5 to 6 atoms, wherein at least one of such atoms is a nitrogen atom. Particularly useful film forming agents are nitrogen- or sulfur-containing cyclic compounds such as benzotriazole, triazole, benzimidazole, imidazole, benzothiazole and derivatives thereof with hydroxy, amino, imino, carboxy, mercapto, nitro, and alkyl substituted groups, as well as urea and thiourea. A preferred film-forming agent is benzotriazole.

Any suitable amount of the film-forming agent can be present in the polishing composition. Typically, about 0.01 wt. % or more (e.g., about 0.1 wt. % or more) film-forming agent will be present in the polishing composition. The amount of film-forming agent in the polishing composition typically will not exceed about 1 wt. %, and more typically will not exceed about 0.5 wt. % (e.g., will not exceed about 0.2 wt. %).

The CMP system additionally can include a dispersing agent. The dispersing agent can be a surfactant that stabilizes the polishing composition against settling, flocculation, and/or decomposition. If a surfactant is present in the CMP system, the surfactant can be an anionic, cationic, nonionic, or amphoteric surfactant or a combination of two or more surfactants. Preferred surfactants useful in the CMP system include dodecyl sulfate sodium salt, sodium lauryl sulfate, dodecyl sulfate ammonium salt, and mixtures thereof. Examples of preferred surfactants include TRITON® DF-16 surfactant manufactured by Union Carbide, and SURFYNOL® surfactant manufactured by Air Products and Chemicals. When the CMP system is used to polish a semiconductor wafer, the presence of a surfactant in the CMP system can be useful to reduce within-wafer-non-uniformity (WIWNU), thereby improving the surface of the polished wafer and reducing wafer defects caused by the CMP process.

Any suitable amount of the dispersing agent can be present in the polishing composition. In general, the dispersing agent should be present in the polishing composition in an amount sufficient to achieve effective stabilization of the CMP system. The precise amount of the dispersing agent typically will vary depending on the particular dispersing agent and the nature of the surface of the abrasive in the CMP system. If an insufficient amount of the dispersing agent is present in the polishing composition, the dispersing agent will have little or no effect on stabilizing the CMP system. If too much dispersing agent is present in the CMP system, the dispersing agent may cause undesirable foaming and/or flocculation in the CMP system. Typically, about 0.001 wt. % or more (e.g., about 0.005 wt. % or more) dispersing agent will be present in the polishing composition. More typically, about 0.01 wt. % or more (e.g., about 0.05 wt. % or more) dispersing agent will be present in the polishing composition. The amount of dispersing agent in the polishing composition typically will not exceed about 1 wt. %, more typically will not exceed about 0.5 wt. % (e.g., will not exceed about 0.2 wt. %).

The CMP system can be prepared in any suitable manner. Typically, the oxidizing agent(s) (if present) and film-forming agent(s) (if present) are combined with the liquid carrier at pre-determined concentrations under shear conditions (typically low shear conditions) until the components of the mixture are homogenously dispersed and/or dissolved in the liquid carrier. The abrasive (if present in the CMP system and to be suspended in the liquid carrier), preferably a concentrated dispersion of the abrasive in a liquid carrier, is added to the mixture under shear conditions and diluted to the desired loading level of abrasive in the CMP system. The dispersing agent (if present) can be added directly to the liquid carrier at an appropriate point in time, e.g., with the oxidizing agent(s) and film-forming agent(s). Alternatively, the surface of the abrasive can be treated with the dispersing agent prior to mixing the abrasive with the other components of the polishing composition. The CMP system optionally is filtered as appropriate to remove undesirable contaminants (e.g., impurities and undesirably large particles).

The invention further provides a method of polishing a substrate using the CMP system of the invention. This method comprises contacting a substrate with the CMP system and abrading at least a portion of the substrate to polish the substrate. As noted above, the CMP system preferably comprises both an abrasive and a polishing pad, with the abrasive in particulate form and suspended in the liquid carrier. In polishing a substrate, the substrate desirably contacts the polishing pad, which are moved relative to each other, with the polishing composition therebetween. The CMP system can be used with any suitable polishing equipment to polish a substrate.

The substrate can be any suitable substrate (e.g., an integrated circuit, rigid memory disk, or magnetic head) and can contain any suitable material (e.g., metal conductive layers and silica insulating layers). Preferred substrates include nickel-containing substrates. The CMP system of the invention is particularly well-suited for polishing a metal substrate, usually with silica as an insulating material.

A substrate as described above preferably is polished in a first step with a first CMP system, such as a conventional CMP system, exhibiting a selectivity for the removal of a conductive metal relative to an insulating layer, and then in a second step with a second CMP system, such as the inventive CMP system, so as to efficiently and satisfactorily polish the substrate, especially without damaging the insulating layer (particularly silica). The first CMP system can be any suitable CMP system for polishing such a substrate, such as a CMP system comprising an abrasive and/or a polishing pad, an oxidizing agent (such as hydrogen peroxide), a complexing agent, and water. When the polishing of the substrate using the first CMP system is complete, the substrate may be washed with deionized water or other solvent(s) to remove the polishing composition of the first CMP system from the partially polished substrate. In the second step, the second CMP system is used to complete the removal of undesired conductive metal. When the polishing of the substrate using the second CMP system is complete, the substrate may be washed with deionized water or other solvent(s) to remove the polishing composition of the second CMP system from the finally polished substrate, which then is ready for further processing.

When the substrate is a rigid memory disk, the additive of the CMP system of the invention can be 1,2,4-triazole or piperazine. Thus, the invention provides a method of polishing a rigid memory disk comprising (i) contacting the rigid memory disk with (a) a liquid carrier, (b) a polishing pad and/or an abrasive, (c) a per-type oxidizer, and (d) an additive selected from the group consisting of 1,2,4-triazole and piperazine, and (ii) abrading at least a portion of the rigid memory disk to polish the rigid memory disk, wherein the various components of the CMP system are otherwise as described above. This method is particularly useful in polishing a rigid memory disk comprising nickel and phosphorous.

The following examples demonstrate the desirable selectivity of the chemical-mechanical polishing system and methods of the invention. These examples, however, should not be construed as in any way limiting the scope of the invention.

EXAMPLE 1

Five chemical-mechanical polishing systems were prepared and evaluated as to polishing effectiveness with standard Ni—P test wafers. Each of the five CMP systems was identical except for a difference in the additive in the polishing composition of the CMP system. Each of the CMP systems comprised an abrasive (suspended in the liquid carrier), a polishing pad, a per-type oxidizer, an additive, and water and had a pH of about 2.5. The abrasive in each of the CMP systems was 4 wt. % condensation-polymerized silicon (Bindzil 50/80® silica, available from Akzo Nobel). The oxidizer in each of the CMP systems was 1.2 wt. % active hydrogen peroxide. The CMP systems were used to polish the standard Ni—P test wafers in the same manner using the same polishing apparatuses and polishing pads.

The first, second, and third CMP systems (control) contained 1 wt. % glycine, 1 wt. % nitrilotriacetic acid, and 1 wt. % 2-aminoethyl dihydrogen phosphate, respectively, as the additive (CMP Systems 1A, 1B, and 1C, respectively). The fourth and fifth CMP systems (inventive) contained 1 wt. % N-(phosphonomethyl) iminodiacetic acid and 1 wt. % of nitrilotris (methylene) triphonic acid, respectively, as the additive (CMP Systems 1D and 1E, respectively).

The test wafers were first subjected to the same CMP system as a "first-step polishing process" so as to obtain test wafers with an average surface roughness (Ra) of 30 to 45 Angstroms. These test wafers then were subjected to each of the aforementioned five CMP systems as a "second-step polishing process." The CMP composition flow rate of 100 ml/min, the down force of 50 N, and the pad rotation speed of 150 revolutions per minute were maintained constant for each of the five CMP systems. The removal rate and the achieved substrate roughness were determined for each of the five CMP systems. The relative removal rates for each CMP system, determined in relation to the other systems using CMP System 1A as the baseline (i.e., removal rate of 1.0) also was determined. The resulting data is set forth in Table 1 below.

Inventive CMP System 1E also exhibited an increased removal rate when compared to the control CMP Systems 1A–1C. CMP System 1E, prepared using an additive of nitrilotris (methylene) triphonic acid, exhibited a removal rate that was nearly 20% better than that of control CMP System 1A, over 50% better than that of control CMP System 1C, and nearly 100% better than control CMP System 1B. In addition, the use of inventive CMP System 1E resulted in a surface roughness very similar to that associated with control CMP Systems 1A–1C.

TABLE 1

Effect of Additive on Removal Rates

| CMP System | Additive | Removal Rate (Å/min) | Relative Removal Rate | Substrate Roughness (Å) |
|---|---|---|---|---|
| 1A (Control) | glycerine<br>H–N(H)–CH$_2$–COOH | 1067 | 1.0 | 1.9 |
| 1B (Control) | nitrilotriacetic acid<br>COOH–N(CH$_2$–COOH)–CH$_2$–COOH | 660 | 0.6 | 2.3 |
| 1C (Control) | 2-aminoethyl dihydrogen phosphate<br>PO$_3$H$_2$–CH$_2$–CH$_2$–NH$_2$ | 813 | 0.8 | 2.0 |
| 1D (Inventive) | N-(phosphonomethyl)-iminodiacetic acid<br>PO$_3$H$_2$–CH$_2$–N(CH$_2$–COOH)–CH$_2$–COOH | 1575 | 1.5 | 2.0 |
| 1E (Inventive) | nitrilotris (methylene) triphonic acid<br>PO$_3$H$_2$–CH$_2$–N(CH$_2$–PO$_3$H$_2$)–CH$_2$–PO$_3$H$_2$ | 1270 | 1.2 | 2.1 |

As is apparent from the data set forth in Table 1, inventive CMP System 1D exhibits considerably higher removal rates than the control CMP Systems 1A–1C without adversely affecting surface roughness. CMP System 1D, prepared using an additive of N-(phosphonomethyl)-iminodiacetic acid, exhibited the highest removal rate. This removal rate was nearly 50% better than the removal rate of control CMP System 1A, nearly 100% better than the removal rate of control CMP System 1C, and over 100% better than the removal rate of control CMP System 1B. Moreover, the use of inventive CMP System 1D resulted in a surface roughness very similar to that associated with the control CMP Systems 1A–1C.

The general structure of the additive used in inventive CMP System 1D was similar to the general structure of the additives used in control CMP Systems 1A, 1B, and 1C. As shown in Table 1, the only difference between the additive of CMP Systems 1D and 1B is the difference, in a single position, between a phosphono group connected to the nitrogen atom through a methylene bridge group and a carboxyl group directly connected to the nitrogen atom. Yet, the removal rate achieved with CMP System 1D was over twice that achieved with CMP System 1B.

Further, the only difference between the additive in inventive CMP System 1E and control CMP System 1B was the existence of the three phosphono groups connected to the nitrogen atom through methylene bridge groups versus three carboxyl groups directly connected to the nitrogen atom. Yet, the removal rate achieved with CMP System 1E was nearly twice that achieved with CMP System 1B.

Thus, it is apparent that the existence of one phosphono group and two carboxyl groups, as in the additive of CMP System 1D, or the existence of three phosphono groups, as in the additive of CMP System 1E, results in a much improved removal rate without a significant adverse affect on surface roughness. This example, therefore, demonstrates that the CMP system of the invention significantly improves metal substrate polishing.

EXAMPLE 2

Three chemical-mechanical polishing systems were prepared and evaluated as to polishing effectiveness with standard Ni—P test wafers in the same manner and with the same polisher and polishing pads as described in Example 1. Each of the three CMP systems comprised the same type and amount of abrasive (suspended in the liquid carrier), the same polishing pad, different per-type oxidizers, and water. One of the CMP systems did not contain an additive of either 1,2,4-triazole or piperazine (CMP System 2A), while the other two CMP systems contained the aforementioned additives (CMP Systems 2B and 2C).

In particular, the control CMP System 2A contained 0.25% hydroxylamine nitrate as a commercial product with no additive as described herein. Inventive CMP Systems 2B and 2C contained 1% hydrogen peroxide as the per-type oxidizer as well as 1% 1,2,4-triazole and 1% piperazine, respectively, as an additive. Control CMP System 2A had a pH of about 2.5, while inventive CMP Systems 2B and 2C had a pH of about 3.5.

The test wafers were first subjected to the same CMP system as a "first-step polishing process" so as to obtain test wafers with an average surface roughness (Ra) of 30 to 45 Angstroms. These test wafers then were subjected to each of the aforementioned three CMP systems as a "second-step polishing process." The CMP composition flow rate of 100 ml/min, the down force of 50 N, and the pad rotation speed of 150 revolutions/min were maintained constant for each of the three CMP systems. The removal rate and relative removal rate was determined for each of the three CMP systems, and the resulting data is set forth in Table 2 below.

TABLE 2

Effect of Additive on Removal Rates

| CMP System | pH | Oxidizer | Additive | Removal Rate (Å/min) | Relative Removal Rate |
|---|---|---|---|---|---|
| 2A (control) | 3.5 | 0.25% hydroxylamine nitrate | none | 635 | 1.0 |
| 2B (inventive) | 2.5 | 0.3 wt. % $H_2O_2$ | 1% 1,2,4-triazole | 940 | 1.5 |
| 2C (inventive) | 2.5 | 0.3 wt. % $H_2O_2$ | 1% piperazine | 1397 | 2.2 |

As is apparent from the data set forth in Table 2, CMP Systems 2B and 2C exhibited considerably higher removal rates than control CMP System 2A. CMP System 2C, prepared using the additive piperazine, showed the greatest improvement in removal rate. The removal rate achieved with CMP System 2C was more than 100% better than that achieved with control CMP Systems 2A. The removal rate achieved with CMP Systems 2B was nearly 50% better than that achieved with control CMP Systems 2A.

Thus, it is apparent that the existence of the additives 1,2,4-triazole (CMP Systems 2B) and piperazine (CMP Systems 2C) result in a much improved removal rate. This example demonstrates that the inventive CMP method involving these additives significantly improves metal substrate polishing.

All references, including publications, patent applications, and patents cited herein, are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Of course, variations of those preferred embodiments will become apparent to those of ordinary skill in the art upon reading the foregoing description. The inventors expect skilled artisans to employ such variations as appropriate, and the inventors intend the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A chemical-mechanical polishing system for a substrate comprising:
   (a) a liquid carrier,
   (b) a polishing pad and/or an abrasive,
   (c) a per-type oxidizer, and
   (d) an additive of the formula

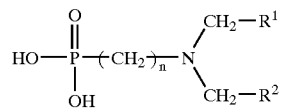

wherein $R^1$ is a carboxyl group, $R^2$ is a phosphono group or a carboxyl group, and n is an integer from 1 to 50.

2. The chemical-mechanical polishing system of claim 1, wherein $R^2$ is a carboxyl group.

3. The chemical-mechanical polishing system of claim 1, wherein both a polishing pad and an abrasive are present, and the abrasive is fixed on the polishing pad.

4. The chemical-mechanical polishing system of claim 1, wherein an abrasive is present in particulate form and is suspended in the carrier.

5. The chemical-mechanical polishing system of claim 4, wherein the abrasive is a metal oxide.

6. The chemical-mechanical polishing system of claim 5, wherein the abrasive is silica.

7. The chemical-mechanical polishing system of claim 1, wherein the carrier is water.

8. The chemical-mechanical polishing system of claim 2, wherein the additive is

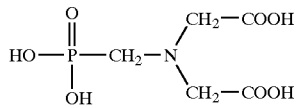

or the salt thereof.

9. The chemical-mechanical polishing system of claim 1, wherein the per-type oxidizer is hydrogen peroxide.

10. The chemical-mechanical polishing system of claim 1, wherein the carrier is water, both a polishing pad and an abrasive are present, the abrasive is a metal oxide, the per-type oxidizer is hydrogen peroxide, and the additive is

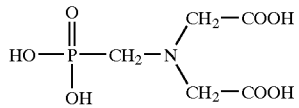

or the salt thereof.

11. The chemical-mechanical polishing system of claim 8, wherein both a polishing pad and an abrasive are present, and the abrasive is fixed on the polishing pad.

12. The chemical-mechanical polishing system of claim 8, wherein an abrasive is present in particulate form and is suspended in the carrier.

13. The chemical-mechanical polishing system of claim 12, wherein the abrasive is a metal oxide.

14. The chemical-mechanical polishing system of claim 13, wherein the abrasive is silica.

15. The chemical-mechanical polishing system of claim 14, wherein the carrier is water.

16. The chemical-mechanical polishing system of claim 15, wherein the per-type oxidizer is hydrogen peroxide.

17. The chemical-mechanical polishing system of claim 10, wherein the abrasive is fixed on the polishing pad.

18. The chemical-mechanical polishing system of claim 10, wherein the abrasive is present in particulate form and is suspended in the carrier.

19. The chemical-mechanical polishing system of claim 18, wherein the abrasive is silica.

* * * * *